United States Patent [19]
Davidsohn, deceased et al.

[11] 3,840,412
[45] Oct. 8, 1974

[54] METHOD OF MAKING SEMICONDUCTOR DEVICES THROUGH OVERLAPPING DIFFUSIONS

[75] Inventors: Uryon S. Davidsohn, deceased, late of Scottsdale, Ariz.; by Amil J. Ajamie, administrator, Phoenix, Ariz.

[73] Assignee: Motorola, Inc., Franklin Park, Ill.

[22] Filed: Aug. 8, 1972

[21] Appl. No.: 278,796

Related U.S. Application Data

[62] Division of Ser. No. 66,163, Aug. 24, 1970, Pat. No. 3,716,425.

[52] U.S. Cl. .................. 148/187, 148/186, 148/189, 148/175, 317/235 R

[51] Int. Cl. .............................................. H01l 7/44

[58] Field of Search .................... 148/187, 175, 186; 317/235

[56] References Cited

UNITED STATES PATENTS

| | | | |
|---|---|---|---|
| 3,509,433 | 4/1970 | Schroeder | 317/235 X F |
| 3,566,219 | 2/1971 | Nelson et al. | 148/186 X |
| 3,575,646 | 4/1971 | Karcher | 317/235 R |
| 3,598,664 | 8/1971 | Kilby | 148/175 |
| 3,653,988 | 4/1972 | Glinski | 148/175 |
| 3,716,425 | 2/1973 | Davidsohn | 148/175 |
| 3,722,079 | 3/1973 | Beasom | 148/187 X |
| 3,736,193 | 5/1973 | Tucker et al. | 148/175 |

*Primary Examiner*—G. T. Ozaki
*Attorney, Agent, or Firm*—Vincent J. Rauner; Willis E. Higgins

[57] ABSTRACT

A method for making an integrated device is disclosed employing a plurality of fully insulated islands having plane walls. Selected diffusion steps are made overlapping certain of the islands and certain of the other diffusion steps.

6 Claims, 7 Drawing Figures

METHOD OF MAKING SEMICONDUCTOR DEVICES THROUGH OVERLAPPING DIFFUSIONS

This is a divisional application of Ser. No. 66,163, filed Aug. 24, 1970, now U.S. Pat. 3,716,425.

BACKGROUND OF THE INVENTION

The integrated circuit manufacturer is constantly striving for making each device located within an integrated circuit smaller so that higher packaging densities are attained. As is well known, one of the problems encountered in this effort is the alignment of successive masks so that successive diffusions or other operations are made within the proper area. Obviously, junctions must be spaced properly if the desired device characteristics are to be obtained.

One limiting factor which has already been reached is the degree in which the photomechanical tasks of masking and etching can be performed. It is felt that these limits have been reached when transistor devices reached the size of a 2.5 mil on a side square.

Complicating the above mentioned problem is the lateral diffusion characteristic of the dopant as it enters the main substrate body of the device. For attaining a certain depth of diffusion, a corresponding proportional lateral diffusion must be tolerated. This lateral diffusion adds to the spacing requirements of integrated circuits.

In addition to the geometric restraints recited above, the manufacture of a radiation hardened device places an additional burden upon the integrated circuit manufacturer. Prior to the base and emitter diffusions, in those situations when the radiation hardening of the device is desired, an N+ annular ring deep diffusion is employed which partially encircles the area into which a base will eventually be diffused for limiting minority carrier spreading and for improving saturation resistance. The ring should not encroach within the depletion width of the base or there is a reduction in breakdown voltage. In high voltage devices this depletion width (2 ohm-cm at 150V) is of the order of 0.5 mils. With photomechanical tolerance included, 0.75 mils between base and ring are required. Obviously, lower voltage devices have lower inherently required separation widths but are generally subject to the same magnitude of the photomechanical tolerance.

SUMMARY OF THE INVENTION

An object of the present invention is to provide an improved integrated circuit device.

Another object of the instant invention is to provide an integrated circuit packaging method capable of fabricating integrated circuit devices of smaller dimensions than that possible using prior art techniques.

A further object of the present invention is to provide an integrated circuit wherein certain of its electrodes are not completely surrounded by other of its electrodes.

A still further object of the present invention is to provide an integrated circuit wherein a plurality of its electrodes are terminated in contact with a common surface.

Another object is to make a common surface from an insulating material.

Quite another object of the instant invention is to provide an integrated circuit of substantially small volume having improved radiation resistance characteristics.

A further object of the instant invention is to provide a method of manufacturing integrated circuits wherein the alignment of masks used in the process is not critical and an opening in a mask exposes a portion of more than one discrete device.

A still further object of the instant invention is to provide a method of manufacturing integrated circuits wherein subsequent diffusions or depositions are made such as to cross insulating channels which normally separate adjacent individual circuits.

These and other objects and features of this invention become more readily apparent from the following description of the accompanying drawings wherein.

BRIEF DESCRIPTION OF THE INVENTION

Anisotropic channel etching in combination with shape back dielectric isolation is employed for attaining minimum spacing between adjacent devices. A silicon dioxide isolation layer surrounds each island. Polycrystalline silicon is employed between the isolated islands. During the construction of the diffusion masks used in making the devices according to the present invention, diffusion windows are made and aligned so as to expose portions of more than one island and their separating channels in an overlapping fashion. Plural depositions are made through the overlapping windows. In one embodiment, enhancement regions are added for improved performance.

DETAILED DESCRIPTION OF THE INVENTION

Figure 1:
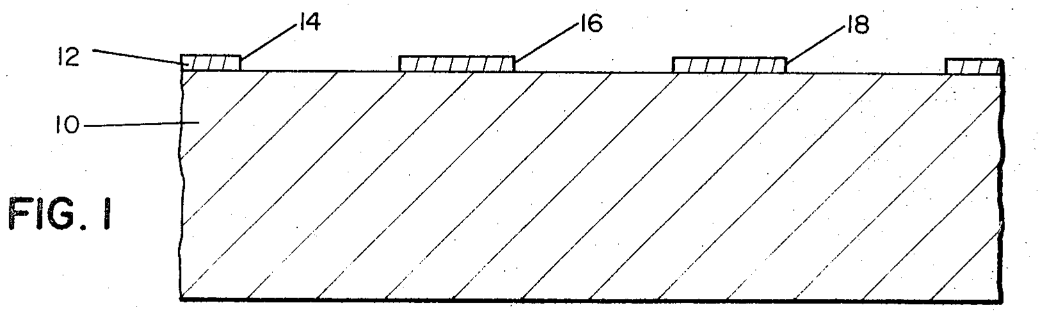
FIGS. 1 through 3 show an embodiment of a device and the method for manufacturing the same according to the teaching of the present invention.
Figure 2:
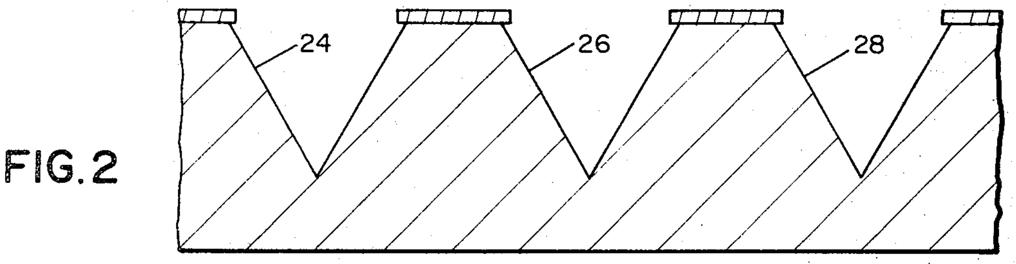
Figure 3:
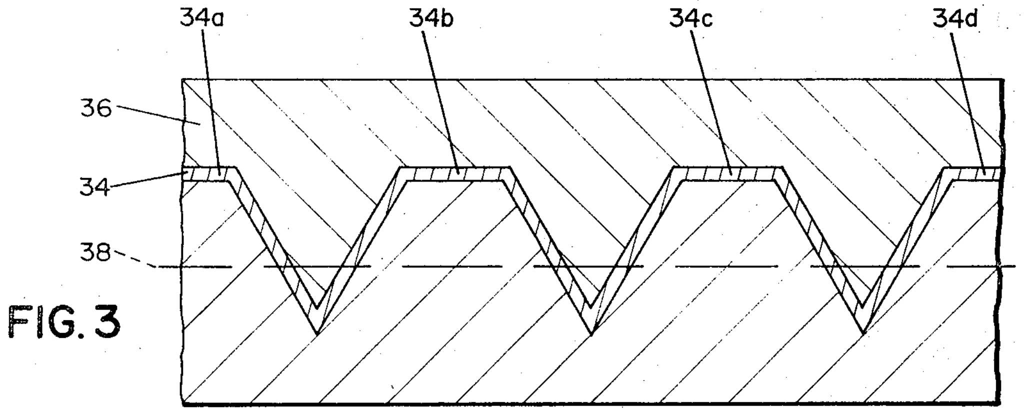

In FIG. 1, a monocrystalline silicon wafer 10, crystallographically oriented for exhibiting a [100] planar surface is provided with an oxide passivated layer 12 patterned according to well known techniques for providing a plurality of windows such as shown at 14, 16, and 18. By the method taught in the copending U.S. Pat. application Ser. No. 743,251, filed July 8, 1968, now abandoned, entitled "Anisotropic Etching of Monocrystalline Silicon" by Uryon S. Davidsohn and assigned to the assignee of the present invention and as shown in FIG. 2, a plurality of grooves 24, 26, and 28 are formed to a uniform depth in the wafer 10. As shown in FIG. 3, the surface 12 is removed and a layer 34 of silicon dioxide or other material having insulating characteristics is uniformly grown or deposited or otherwise formed on the etched wafer 10.

The structure of FIG. 3 is further modified by the deposition of a polycrystalline silicon layer 36 upon oxide layer 34 completely filling the grooves 24, 26, and 28, and, in addition, providing a sufficient thickness to ensure mechanical support of the completed device.

Figure 4:
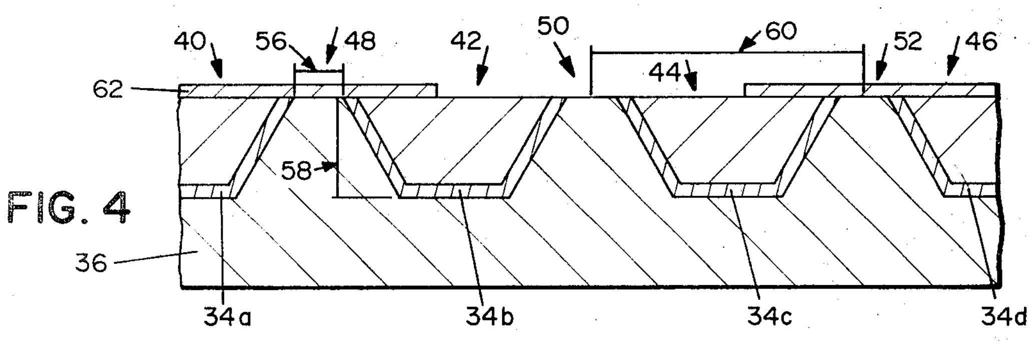
FIG. 4 shows a plurality of insulated islands within which the electrodes of the device are constructed.

Then, to the extent indicated by a dotted line 38 in FIG. 3, the wafer 10 and part of the oxide layer 34 is lapped and polished by well known techniques in a "shapeback" technique for forming a plurality of islands 40, 42, 44 and 46 as shown in FIG. 4, each of which islands is separated from a next adjacent island by a double thickness of insulating material formed from a portion of original layer 34 and a channel region formed from a portion of the polycrystalline silicon layer 36 originally deposited in the grooves 24, 26 and 28. Representative channel regions are shown at 48, 50 and 52. The upper width of a channel, as identified by a line 56, is 0.25 mil (two hundred fifty millionths of an inch). The depth of a channel as indicated by a line 58 is 0.5 mil (five hundred millionths of an inch). The channel centers are spaced 1.25 mils on center as shown by a line 60.

A passivation layer 62 of silicon is formed over the structure shown in FIG. 4. However, this formation and/or etching out of selected windows are not shown in the figures accompanying the explanation of the invention with reference to FIGS. 5 and 6 since the use of such techniques are standard in the art.

Figure 7:
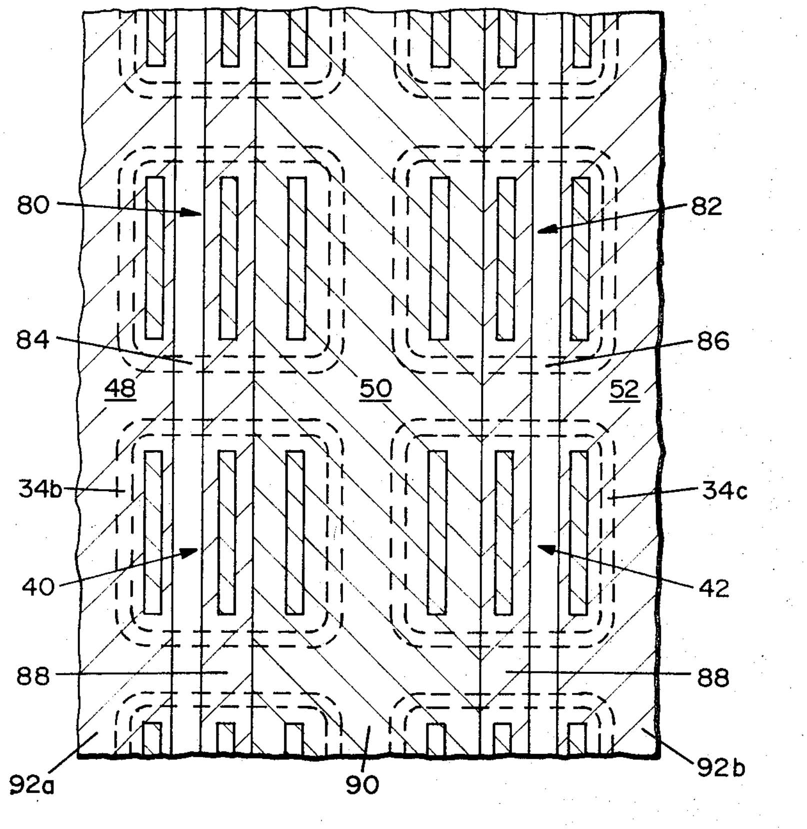
FIG. 7 shows a plan view of a plurality of devices made according to the teaching of the instant invention.

The material forming the islands is of one conductivity type and for the purpose of this explanation is identified as N type. A base diffusion window is opened in the passivation layer 62 and P type material such as boron is diffused into an upper surface 63 of the semiconductor wafer 10 and into the upper surfaces of the islands, forming the PN junction indicated by the line 64. In the embodiment shown, the diffusion for the base area is made through a window or opening that is larger than the size of the island and is made to form a PN junction in the plurality of adjacent islands. In this manner, the diffusions overlap a plurality of islands and the diffusion is limited by the vertical oxide such as **34*b*. As shown in FIG. 7, the diffusion and subsequent diffusions are made in long "stripes" across the substrate 10. This junction line and other junction lines are shown traversing the channels 48, 50 and 52. However, multiple diffusions into the polycrystalline silicon channel area are of no effect as long as no contact is made to this area. The oxide layers 34*a* through 34*d* provide isolation for the devices formed there within the respective islands 40, 42, 44 and 46. No diffusions penetrate the oxide layers 34a through 34*d*. As an example of individual island construction the oxide layer 34*b* further comprises a lower oxide layer 65 which is substantially parallel to the upper surface 63 and further comprises a side member 66 which extends to the surface 63 for enclosing a portion of the monocrystalline wafer 10.**

When the base diffusion oxide aperture is made larger than the overall island size, or more specifically, is made to cover the entire island size or a plurality of islands, the base area is controlled by the dimensions of the islands. The side member 66 of each oxide layer limits the diffusions into the wafer 10. Various techniques are available for forming a collector contact such as a subsequent deep diffusion of N+ material for making contact with the collector.

Figure 5:
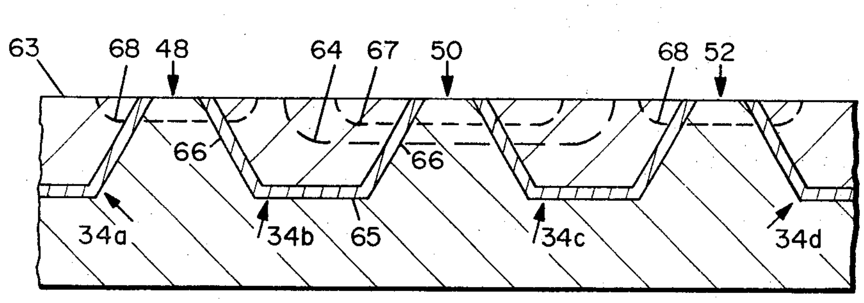
FIG. 5 shows the diffusion of the various electrode areas into the device.

The emitter diffusion is made through a mask opening which exposes adjacent portions of a plurality of islands such that a plurality of emitters are diffused through the same identical mask opening. In FIG. 5, the N type material can be phosphorus and the PN base-emitter junction is shown by a line 67. The island and its various PN junctions diffused there into is characterized by having a plurality of PN junctions intersecting a plurality of sides 66 of an island. By the geometry described hereinbefore, only one edge of the PN junction extends to the surface of each island for each diffusion while, as mentioned hereinabove, a plurality of junction edges are buried within the islands and intersect the sides 66 of the oxide layers **34*a* through 34*d*.**

A collector enhancement diffusion of N+ material is performed over adjacent islands opposite to those adjacent islands over which the emitter diffusion is made. Again, the N+N junction is shown by a line 68 extending within the polycrystalline body 36 but intersected by the oxide sides 66 of the island pairs **34*a* and 34*b*, and 34*c* and 34*d* or as shown in FIG. 5.**

Figure 6:
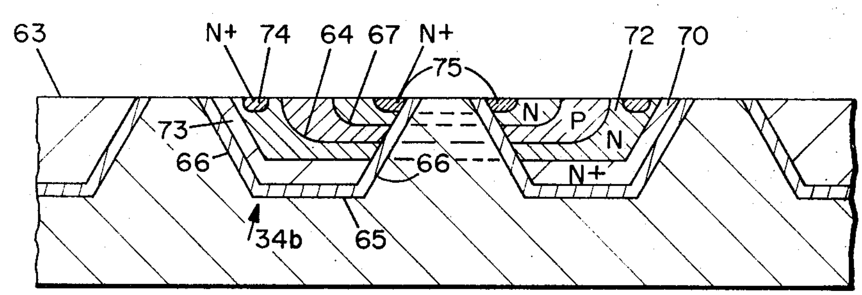
FIG. 6 shows another embodiment of the invention employing a deep N+ sidewall to reduce the saturation resistance.

The embodiment shown in FIG. 6 shows an increased number of diffusions into the islands. Similar items in FIG. 6 carry the same identifying indicia as those employed hereinbefore.

A deep layer of N+ conductivity is shown within the island. This layer is identified generally at 70 and comprises the original material from which the islands are formed. Since the devices made according to the teaching of the present invention are made by the process of overlapping diffusions, the preferred shape of the layer 70 is L-shaped in cross section. More specifically, the latter diffusions are made in long stripes thereby changing the conductivity type of the original wafer 10. A later diffusion modifying the N+ conductivity of the ring 70 is made according to the teaching of the present invention forming a collector area 72.

This diffusion is made in a long stripe over adjacent columns of islands whereby substantially all of the N+ material of the layer 70 is changed in N. In the preferred embodiment, as shown in FIG. 6, a side member 73 of the layer 70 extends to the surface 63. The N+ conductivity type material limits minority carrier spreading and improves saturation resistance of the device.

A collector enhancement region is shown at 74 while the base collector junction remains identified at 64 and the base-emitter junction is shown at 67. An emitter enhancement region is shown at 75.

Referring to FIG. 7, there is shown a plan view of a plurality of transistors made according to the teaching of the instance invention. A plurality of islands are indicated generally as 40 and 42, referring to the identifying indicia used in relation to FIG. 4, and an additional plurality of islands 80 and 82. The islands 40 and 42 are insulated from the body of polycrystalline silicon 36 by silicon dioxide layer **34*b* and 34*c* while the islands 80 and 82 are insulated from the body of polycrystalline silicon by silicon dioxide layers 84 and 86** respectively. In actual practice, many additional islands are placed adjacent to those shown and arranged in columns and rows as illustrated so that the diffusions described hereinbefore and hereafter take place in long stripes.

The base diffusion is shown represented by the cross hatching at 88 and is shown reacting with islands displaced in both directions so as to diffuse a base region in adjacent columns of islands. An emitter diffusion is shown represented by the cross hatching at 90 located within the base area but overlapping adjacent columns of islands. It should be borne in mind as shown more clearly with reference to FIG. 5, the base diffusion covers that area shown as 88 and 90 originally, then the emitter diffusion changes the conductivity type of the surface area in the region 90. The collector enhancement region is represented by cross hatching 92a and 92b and such regions overlap additionally similar columns of islands located adjacent to those columns shown so that the enhancement diffusion also overlaps adjacent columns of islands.

When contact openings are made in final oxide, the diffused areas in the polycrystalline silicon, such as 48 and 50, are carefully avoided. The metallization for the contacts is made in stripe like fashion but no overlap of oxide isolation or, polycrystalline silicon or adjacent islands occurs.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In the art of making diffusions into a semiconductive structure of the type wherein a plurality of individual device regions of a first conductivity type are separated from each other by regions of dielectric material into which conductivity type determining impurities do not penetrate, and a region of polycrystalline material being positioned between pairs of dielectric regions, and wherein surface portions of each such device regions, dielectric regions and polycrystalline regions are exposed at the major surface of the semiconductor structure, the method of making diffusions simultaneously into portions of at least a pair of adjacent device regions, comprising the steps of:

forming a first diffusion mask having a first opening exposing portions of at least a pair of adjacent regions and the intervening dielectric material and polycrystalline material; and diffusing a dopant material through said opening for altering said first conductivity type and simultaneously forming in portions of such pair of adjacent device regions a corresponding pair of additional and different conductivity type regions.

2. In the art of making diffusions into a semiconductive structure of the type wherein a plurality of individual device regions of a first conductivity type are separated from each other by a region of dielectric material into which conductivity type determining impurities will not penetrate and the dielectric region being coplanar with the surface of the semiconductor structure and extending from the major surface of the semiconductor surface to a depth greater than any subsequent diffusion extends, and wherein surface portions of each such device region are exposed at the major surface of the semiconductor structure, the method of making diffusions simultaneously into portions of at least a pair of adjacent regions, comprising the steps of:

forming a first diffusion mask having a first opening exposing portions of at least a pair of adjacent regions and the intervening dielectric material; and diffusing a dopant material through said opening for altering said first conductivity type and simultaneously forming in portions of such pair of adjacent regions a corresponding pair of additional and different conductivity type regions.

3. In the art of making diffusions into a semiconductive structure of the type wherein an individual active device region is separated from a non-device region by a region of dielectric material into which conductivity type determining impurities do not penetrate, and the dielectric region extends from the major surface of the semiconductor structure to a depth greater than any subsequent diffusion extends, and wherein a surface portion of such active device region is exposed at the major surface of the semiconductor structure, the method of making diffusions simultaneously into a portion of an active device region and into a portion of the non-device region, comprising the steps of:

forming a first diffusion mask having a first opening exposing a portion of the active device region and a portion of the non-device region and the intervening region of dielectric material; and diffusing a dopant material through said opening for altering said first conductivity type of said active device region and simultaneously forming a doped region in said non-device region.

4. The method as recited in claim 3 and further including the steps of:

forming a second diffusion mask having a second opening exposing a smaller portion of the active device region into which said last diffusion was made and exposing a portion of the non-device region and the intervening region of dielectric material; and diffusing an opposite conductivity type dopant through said opening for establishing simultaneously a region of opposite conductivity type within said active device region and said non-device region whereby, multiple diffusions into said non-device region do not affect the characteristic of the active device region due to the isolating effect of the dielectric region.

5. In the art of making diffusions into a semiconductive structure of the type containing a plurality of individual active device regions, and each of said regions having positioned adjacent thereto a region of dielectric material into which conductivity type determining impurities do not penetrate, and the dielectric region extends from the major surface of the semiconductor structure to a depth greater than any subsequent diffusion extends, and a region of polycrystalline material is positioned intermediate said regions of dielectric material, and wherein surface portions of each such device region are exposed at the major surface of the semiconductor structure, the method of making diffusions simultaneously into only a portion of an active device region, comprising the steps of:

forming a first diffusion mask having a first opening exposing a portion of the active device region and a portion of the polycrystalline material and the intervening dielectric material; and diffusing a dopant material through said opening for altering the conductivity type of said active device region and simultaneously forming a doped region in said portion of said polycrystalline region exposed through said opening.

6. The method as recited in claim 5 and further including the steps of:

forming a second diffusion mask having a second opening exposing a smaller portion of the active device region into which said last diffusion was made, and exposing the intervening region of dielectric material and a portion of the polycrystalline region; and diffusing an opposite conductivity type dopant through said opening for establishing simultaneously a region of opposite conductivity type within said active device region and the polycrystalline region whereby, multiple diffusions into said polycrystalline region do not affect the characteristics of the active device region due to the isolating effect of the dielectric region.

* * * * *